(12) United States Patent
Yu et al.

(10) Patent No.: US 10,957,974 B2
(45) Date of Patent: Mar. 23, 2021

(54) ANTENNA BASE FOR FIXING AN ANTENNA BODY ON A CASING, ANTENNA STRUCTURE HAVING THE ANTENNA BASE, AND ELECTRONIC DEVICE HAVING THE ANTENNA STRUCTURE

(71) Applicant: Wistron Corporation, New Taipei (TW)

(72) Inventors: Chung-Ta Yu, New Taipei (TW); I-Hsiang Wang, New Taipei (TW)

(73) Assignee: Wistron Corporation, New Taipei (TW)

( * ) Notice: Subject to any disclaimer, the term of this patent is extended or adjusted under 35 U.S.C. 154(b) by 379 days.

(21) Appl. No.: 15/900,806

(22) Filed: Feb. 21, 2018

(65) Prior Publication Data

US 2019/0157752 A1 May 23, 2019

(30) Foreign Application Priority Data

Nov. 17, 2017 (TW) .................................. 106139807

(51) Int. Cl.
*H01Q 1/48* (2006.01)
*H01Q 1/22* (2006.01)
(Continued)

(52) U.S. Cl.
CPC ........... *H01Q 1/523* (2013.01); *H01Q 1/2258* (2013.01); *H01Q 1/38* (2013.01); *H01Q 1/48* (2013.01);
(Continued)

(58) Field of Classification Search
CPC .... H01Q 1/2275; H01Q 1/088; H04B 1/3816; H05K 3/366; H05K 9/0028;
(Continued)

(56) References Cited

U.S. PATENT DOCUMENTS 5,600,102 A * 2/1997 Socha .................. H01R 12/721
174/261
5,904,581 A * 5/1999 Pope .................... H01R 12/716
439/74
(Continued)

FOREIGN PATENT DOCUMENTS

CN 101728627 A 6/2010
CN 104934678 A 9/2015
(Continued)

*Primary Examiner* — Ricardo I Magallanes
(74) *Attorney, Agent, or Firm* — Winston Hsu

(57) ABSTRACT

The present disclosure discloses an antenna base for fixing an antenna body on a casing. The antenna base includes a base plate and a slot structure. The base plate is fixed on the casing. The slot structure includes a first side wall, a second side wall, and at least one welding structure. The first side wall and the second side wall are connected to the base plate and opposite to each other. An accommodating slot is formed between the first side wall and the second side wall for accommodating the antenna body. The at least one welding structure is disposed on the first side wall and for welding with the antenna body. In such a way, the antenna base is suitable for various antenna bodies with different structures according to practical demands without redesigning different molds for different antenna bases, which effectively reduces manufacturing cost.

37 Claims, 8 Drawing Sheets

(51) Int. Cl.
*H05K 3/36* (2006.01)
*H01Q 1/52* (2006.01)
*H01Q 13/10* (2006.01)
*H01Q 21/08* (2006.01)
*H01Q 1/38* (2006.01)

(52) U.S. Cl.
CPC ............ *H01Q 13/10* (2013.01); *H01Q 21/08* (2013.01); *H05K 3/366* (2013.01); *H05K 2201/10454* (2013.01)

(58) Field of Classification Search
CPC ........ H05K 2201/10454; H01R 12/737; H01R 12/707; H01R 43/0256; H01R 9/0515
See application file for complete search history.

(56) References Cited

U.S. PATENT DOCUMENTS

| | | | | |
|---|---|---|---|---|
| 2007/0096995 | A1* | 5/2007 | Lee | H01Q 1/243 |
| | | | | 343/702 |
| 2009/0058733 | A1* | 3/2009 | Kurashima | H01Q 1/22 |
| | | | | 343/700 MS |
| 2011/0122045 | A1* | 5/2011 | Seo | H01Q 9/40 |
| | | | | 343/906 |
| 2012/0075162 | A1* | 3/2012 | Livingston | H01Q 1/088 |
| | | | | 343/884 |

FOREIGN PATENT DOCUMENTS

| | | |
|---|---|---|
| CN | 106450736 A | 2/2017 |
| TW | M316502 | 8/2007 |

\* cited by examiner

ANTENNA BASE FOR FIXING AN ANTENNA BODY ON A CASING, ANTENNA STRUCTURE HAVING THE ANTENNA BASE, AND ELECTRONIC DEVICE HAVING THE ANTENNA STRUCTURE

BACKGROUND OF THE DISCLOSURE

1. Field of the Disclosure

The present disclosure relates to an antenna base, a related antenna structure and a related electronic device, and more particularly, to an antenna base commonly adapted for various types of antenna bodies, a related antenna structure and a related electronic device.

2. Description of the Prior Art

With advance of digital and wireless technologies, an electronic device is usually equipped with an antenna structure and a wireless communication chipset to provide a wireless communication function. In order to meet different design requirements, different electronic devices usually have different antenna structures, and sometimes even there are multiple antenna structures in one electronic device. However, the antenna structure is usually made of metal material. Furthermore, different antenna structures which have different shapes have to be manufactured by different molds, and the cost of the mold is the largest part of the manufacturing cost of the antenna structure. Therefore, when the design of the antenna structure needs to be adjusted, the mold needs to be redesigned accordingly, which results in a dramatic increase in manufacturing cost.

SUMMARY OF THE DISCLOSURE

Therefore, it is an objective of the present disclosure to provide an antenna base commonly adapted for various antenna bodies, a related antenna structure and a related electronic device for solving the aforementioned problems.

In order to achieve the aforementioned objective, the present disclosure discloses an antenna base for fixing an antenna body on a casing. The antenna base includes a base plate and a slot structure. The base plate is fixed on the casing. The slot structure includes a first side wall a second side wall and at least one welding structure. The first side wall is connected to the base plate. The second side wall is connected to the base plate and opposite to the first side wall. An accommodating slot is formed between the first side wall and the second side wall for accommodating the antenna body. The at least one welding structure is disposed on the first side wall and for welding with the antenna body.

In order to achieve the aforementioned objective, the present disclosure discloses an antenna structure includes at least one antenna body and an antenna base. The at least one antenna body is for emitting or receiving wireless signals. The antenna base is for fixing the at least one antenna body on a casing. The antenna base includes a base plate and a slot structure. The base plate is fixed on the casing. The slot structure includes a first side wall, a second side wall, and at least one welding structure. The first side wall is connected to the base plate. The second side wall is connected to the base plate and opposite to the first side wall. An accommodating slot is formed between the first side wall and the second side wall for accommodating the at least one antenna body. The at least one welding structure is disposed on the first side wall and for welding with the at least one antenna body.

In order to achieve the aforementioned objective, the present disclosure discloses an electronic device including a casing and at least one antenna structure. The at least one antenna structure is installed on the casing. The at least one antenna structure includes at least one antenna body and an antenna base. The at least one antenna body is for emitting or receiving wireless signals. The antenna base is for fixing the at least one antenna body on the casing. The antenna base includes a base plate and a slot structure. The base plate is fixed on the casing. The slot structure includes a first side wall, a second side wall, and at least one welding structure. The first side wall is connected to the base plate. The second side wall is connected to the base plate and opposite to the first side wall. An accommodating slot is formed between the first side wall and the second side wall for accommodating the at least one antenna body. The at least one welding structure is disposed on the first side wall and for welding with the at least one antenna body.

In summary, the present disclosure provides the two-piece antenna structure. The slot structure of the antenna base can accommodate various types of antenna bodies with various sizes according to practical demands without redesigning different molds for different antenna bases. Therefore, it effectively reduces manufacturing cost. Furthermore, the antenna base of the present disclosure is suitable for the antenna body with a specific range of size, i.e., a length of the antenna body can be designed to be less than or equal to a length of the accommodating slot. The antenna base even can accommodate multiple antenna bodies as long as the antenna bodies do not interfere with each other. Therefore, the present disclosure has a universal use.

These and other objectives of the present disclosure will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the disclosure may be practiced. In this regard, directional terminology, such as "top," "bottom," "front," "back," etc., is used with reference to the orientation of the Figure(s) being described. The components of the present disclosure can be positioned in a number of different orientations. As such, the directional terminology is used for purposes of illustration and is in no way limiting. Accordingly, the drawings and descriptions will be regarded as illustrative in nature and not as restrictive.

Figure 1:
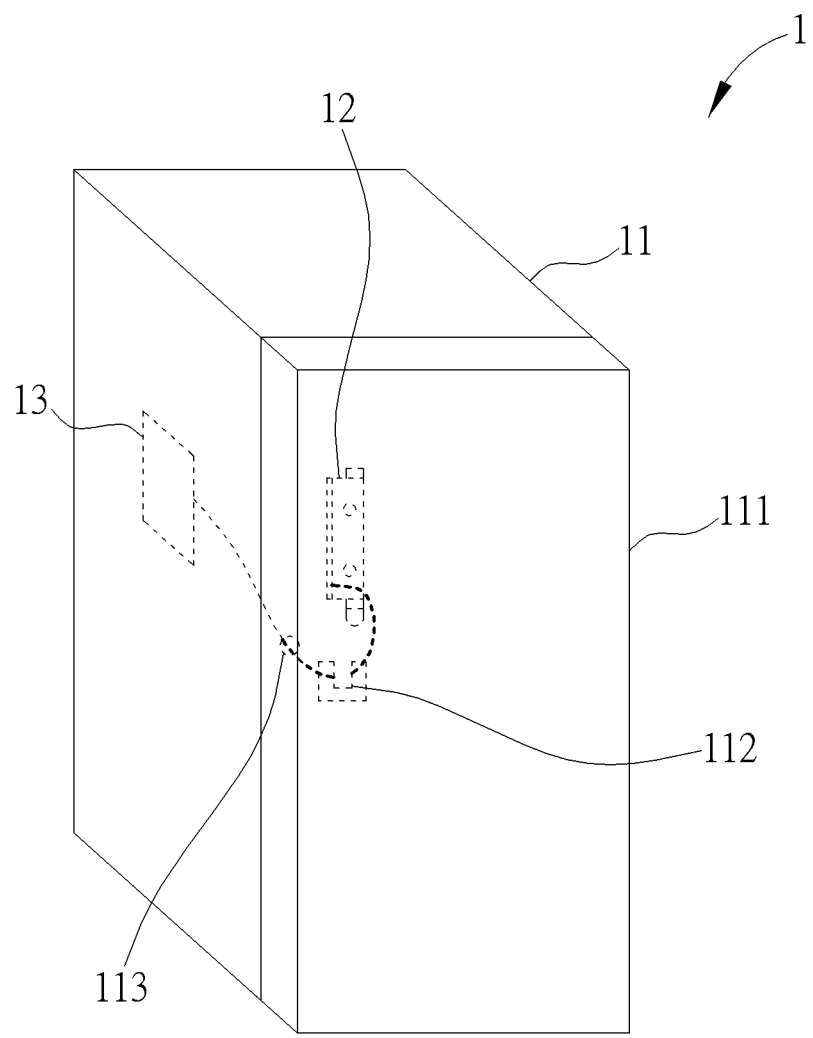
FIG. 1 is a schematic diagram of an electronic device according to a first embodiment of the present disclosure.
Figure 2:
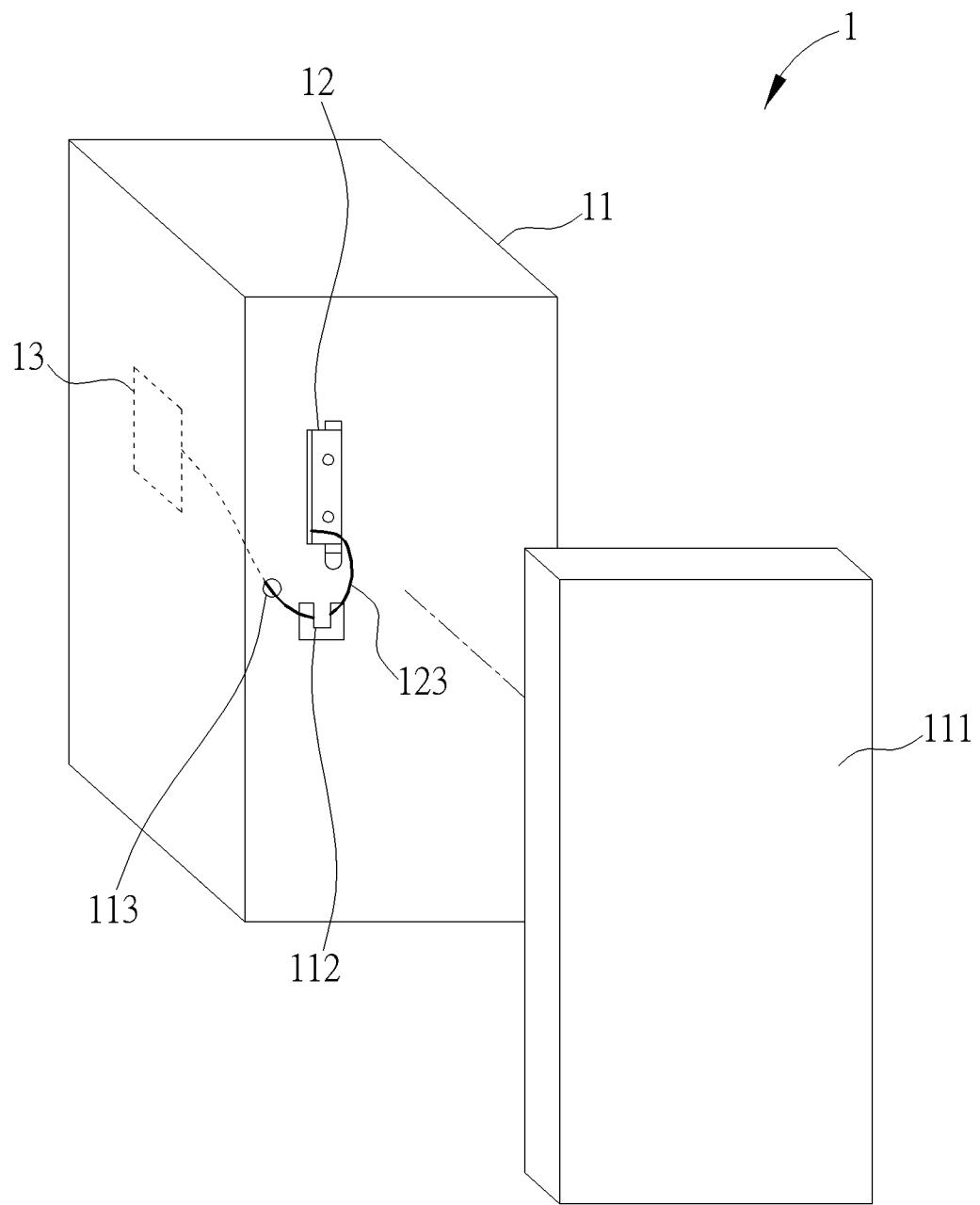
FIG. 2 is a partial exploded diagram of the electronic device according to the first embodiment of the present disclosure.

Please refer to FIG. 1 and FIG. 2. FIG. 1 is a schematic diagram of an electronic device 1 according to a first embodiment of the present disclosure. FIG. 2 is a partial exploded diagram of the electronic device 1 according to the first embodiment of the present disclosure. As shown in FIG. 1 and FIG. 2, the electronic device 1 includes a casing 11, an antenna structure 12, and a wireless communication unit 13. In this embodiment, the electronic device 1 can be a desktop computer with wireless communication function. However, the present disclosure is not limited thereto. In another embodiment, the electronic device 1 also can be a wireless communication device with wireless communication function, such as a media box, a digital set up box, or an internet of things (IoT) gateway. Furthermore, the number and the configuration of the antenna structure 12 are not limited to those illustrated in the figures of this embodiment. The antenna structure 12 is installed on the casing 11. The wireless communication unit 13 is disposed inside the casing 11 and electrically connected to the antenna structure 12. The wireless communication unit 13 is for processing wireless signals. The antenna structure 12 is for emitting or receiving the wireless signals. In this embodiment, the wireless communication unit 13 can be a wireless communication chipset. Besides, the casing 11 can include a cover plate 111 for covering the antenna structure 12, so as to protect the antenna structure 12 from collision and to improve aesthetic appearance of the electronic device 1.

Figure 3:
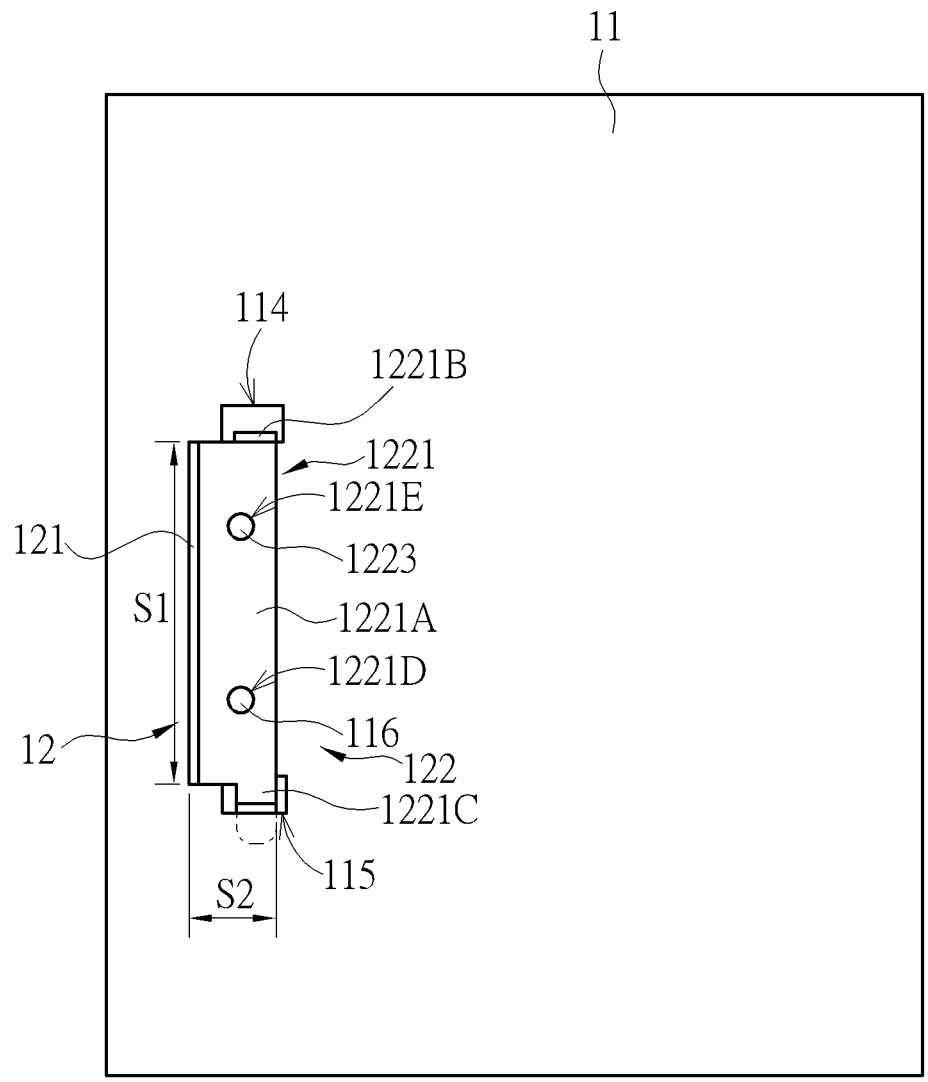
FIG. 3 is a partial diagram of the electronic device according to the first embodiment of the present disclosure.
Figure 4:
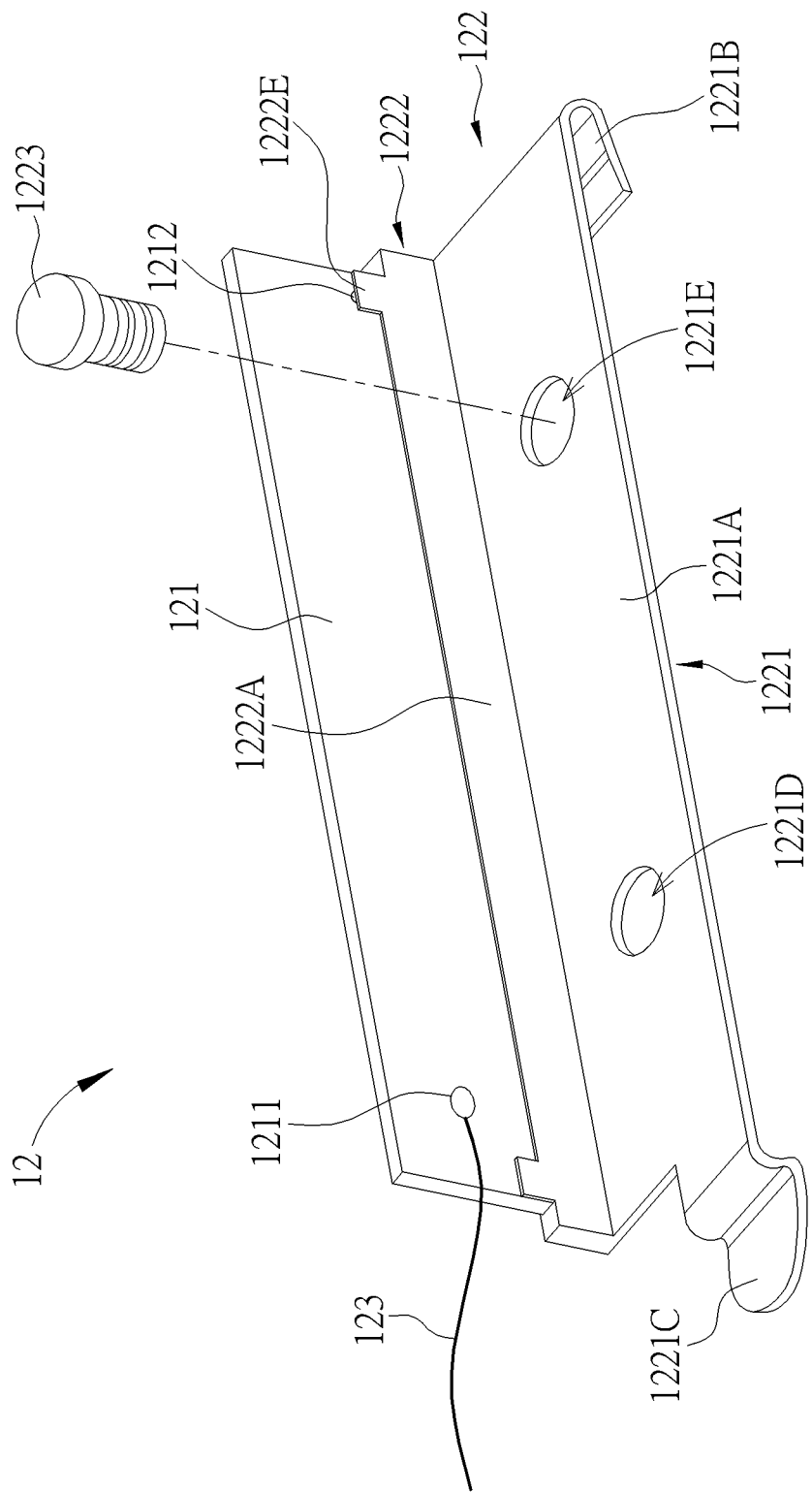
FIG. 4 is a diagram of an antenna structure according to the first embodiment of the present disclosure.

Please refer to FIG. 2 to FIG. 4. FIG. 3 is a partial diagram of the electronic device 1 according to the first embodiment of the present disclosure. FIG. 4 is a diagram of the antenna structure 12 according to the first embodiment of the present disclosure. As shown in FIG. 2 to FIG. 4, the antenna structure 12 includes an antenna body 121, an antenna base 122, and a feeding cable 123. The antenna base 122 is for fixing the antenna body 121 on the casing 11. The feeding cable 123 is connected to a feeding terminal 1211 of the antenna body 121 and the wireless communication unit 13. In this embodiment, the antenna body 121 can be a printed circuit board printed with a circuit as a radiation pattern, and the antenna base 122 can be made of metal material. However, the present disclosure is not limited thereto. Furthermore, in order to route the feeding cable 123, the casing 11 can further include at least one claw hook 112 for fixing the feeding cable 123 and at least one aperture 113 for allowing the feeding cable 123 to pass therethrough.

Besides, the antenna base 122 includes a base plate 1221, a slot structure 1222, and a fixing component 1223. The base plate 1221 includes a main body 1221A, a first engaging component 1221B, and a second engaging component 1221C. The first engaging component 1221B and the second engaging component 1221C respectively extend from two opposite sides of the main body 1221A for engaging with a first engaging slot 114 and a second engaging slot 115 of the casing 11. In this embodiment, the first engaging component 1221B can be a hook-shaped structure, and the second engaging component 1221C can be a step-shaped structure. However, the present disclosure is not limited thereto. Furthermore, a positioning hole 1221D and a through hole 1221E are formed on the main body 1221A. The positioning hole 1221D is for cooperating with a positioning component 116 of the casing 11, and the through hole 1221E is for allowing the fixing component 1223 to pass therethrough. In this embodiment, the positioning component 116 can be a positioning protrusion, and the fixing component 1223 can be a screw.

When it is desired to fix the antenna base 122 on the casing 11, the step-shaped second engaging component 1221C can be obliquely inserted into the second engaging slot 115 firstly. Afterwards, the hook-shaped first engaging component 1221B can engage with the first engaging slot 114. At this moment, the positioning component 116 also engages with the positioning hole 1221D. Therefore, the base plate 1221 can be fixed on the casing easily by passing the fixing component 1223 through the through hole 1221E to engage with the casing 11. However, the fixing mechanism of the antenna base 122 and the casing is not limited to this embodiment. For example, in another embodiment, the antenna base 122 also can be fixed on the casing 11 by an adhesive layer. It depends on practical demands. Furthermore, as shown in FIG. 3, in this embodiment, the base plate 1221 can preferably be a rectangular structure with a side length S1 of about 40 millimeters and another side length S2 of about 10 millimeters. However, the present disclosure is not limited thereto. It depends on practical demands.

Figure 5:
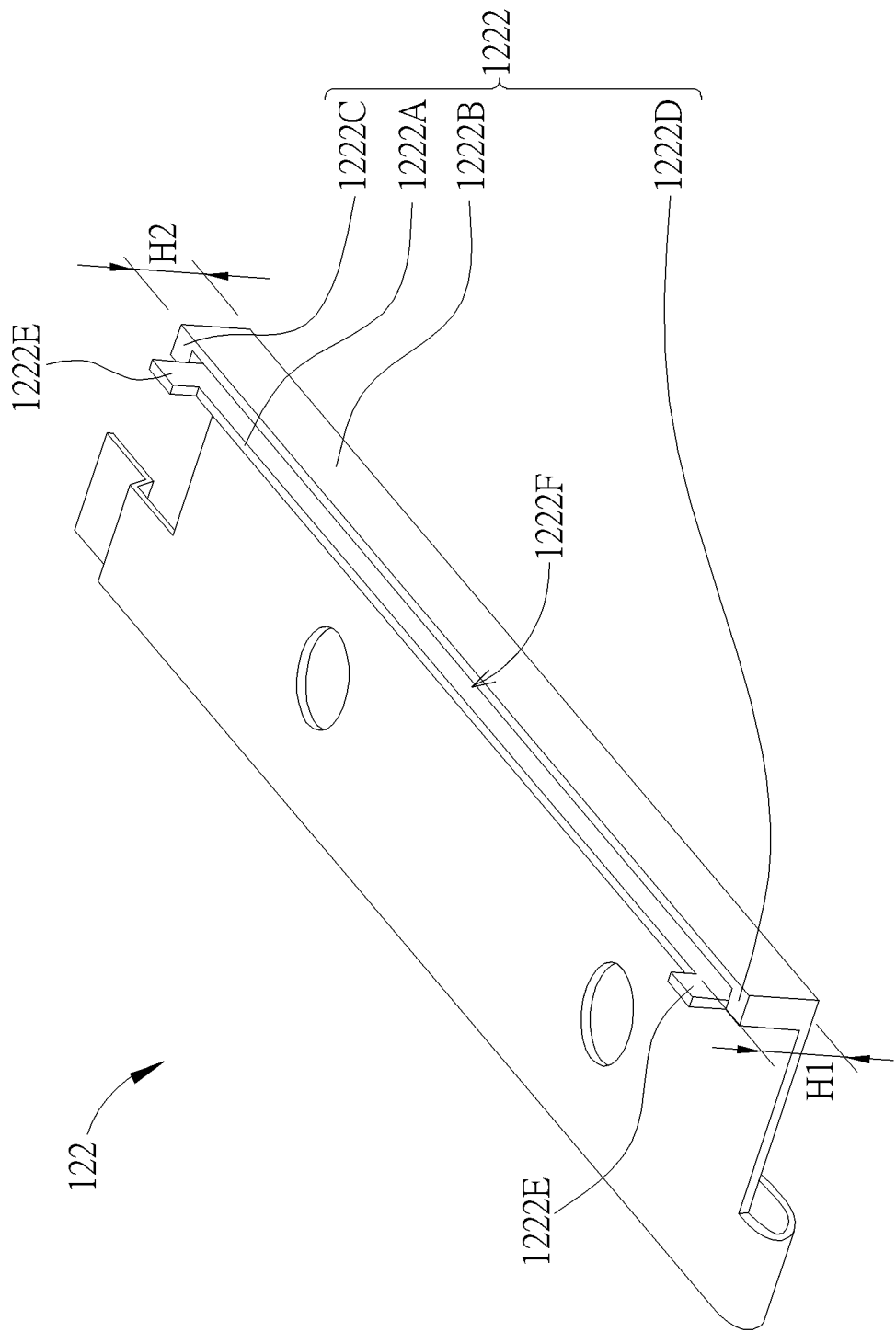
FIG. 5 is a diagram of an antenna base according to the first embodiment of the present disclosure.

Please refer to FIG. 4 and FIG. 5. FIG. 5 is a diagram of the antenna base 122 according to the first embodiment of the present disclosure. As shown in FIG. 4 and FIG. 5, the slot structure 1222 includes a first side wall 1222A, a second side wall 1222B, a third side wall 1222C, a fourth side wall 1222D, and two welding structures 1222E. The first side wall 1222A, the second side wall 1222B, the third side wall 1222C, and the fourth side wall 1222D are connected to and substantially perpendicular to the main body 1221A. The first side wall 1222A and the second side wall 1222B are substantially parallel to and opposite to each other. The third side wall 1222C is connected to the first side wall 1222A and the second side wall 1222B. The fourth side wall 1222D is connected to the first side wall 1222A and the second side wall 1222B. A height H1 of the first side wall 1222A is greater than a height H2 of the second side wall 1222B for providing additional welding joints. An accommodating slot 1222F is formed among the first side wall 1222A, the second side wall 1222B, the third side wall 1222C, and the fourth side wall 1222D for accommodating the antenna body 121. The two welding structures 1222E are disposed on two distal ends of the first side wall 1222A for welding with two sides of the antenna body 121.

It should be noticed that, in this embodiment, one of the two welding structures 1222E can be located at a position corresponding to a ground terminal 1212 of the antenna body 121. When the antenna body 121 is accommodated inside the accommodating slot 1222F, the ground terminal 1212 of the antenna body 121 can be welded with and electrically connected to the corresponding welding structure 1222E, so as to provide a ground connection for the antenna body 121. In other words, the welding structures 1222E can be implemented as mechanical connections as well as electrical connections. However, the welding structure 1222E of the present disclosure is not limited thereto. In another embodiment, the slot structure 1222 also can include only one welding structure 1222E, and/or the welding structure 1222E can be located at another position and not electrically connected to the ground terminal 1212 of the antenna body 121.

Figure 6:
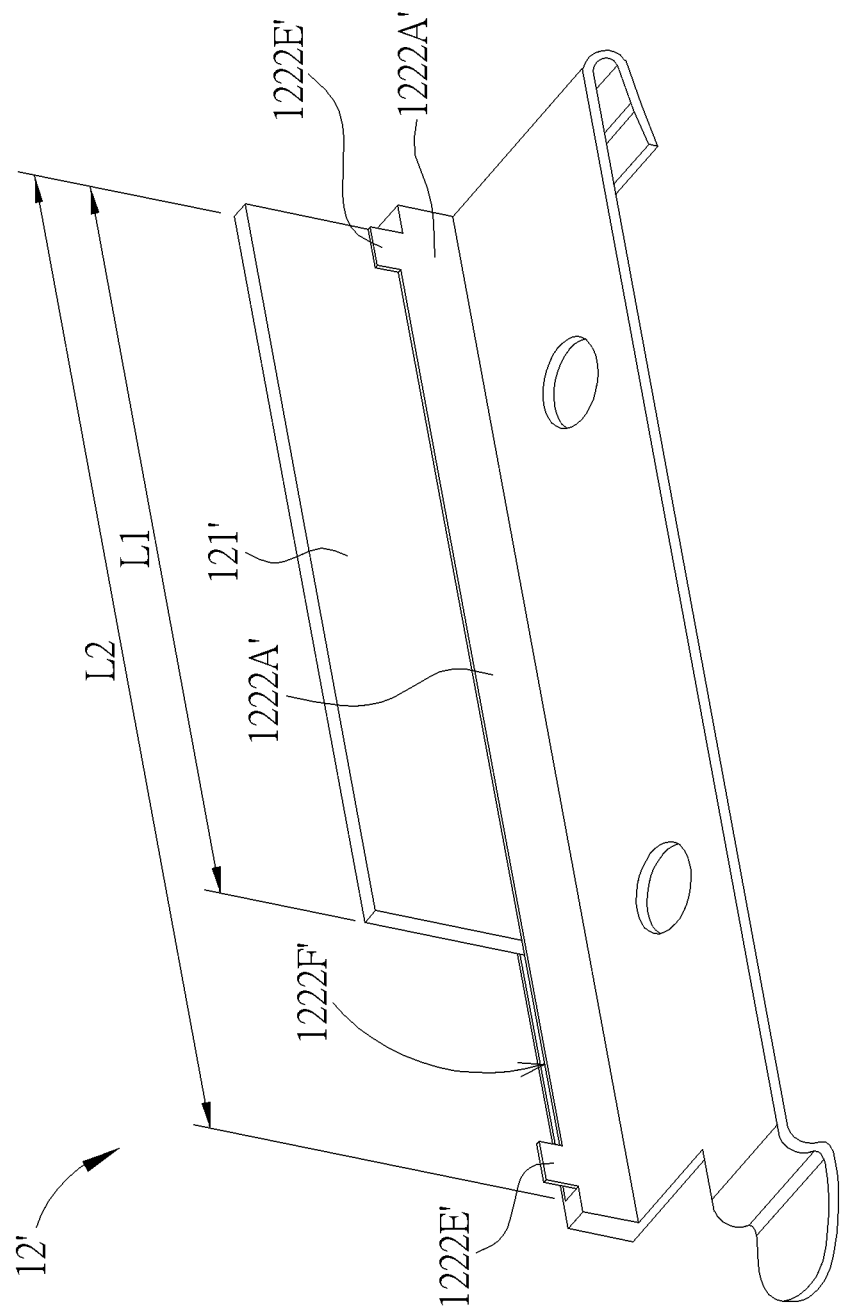
FIG. 6 and FIG. 7 are partial diagrams of an antenna structure at different views according to a second embodiment of the present disclosure.
Figure 7:
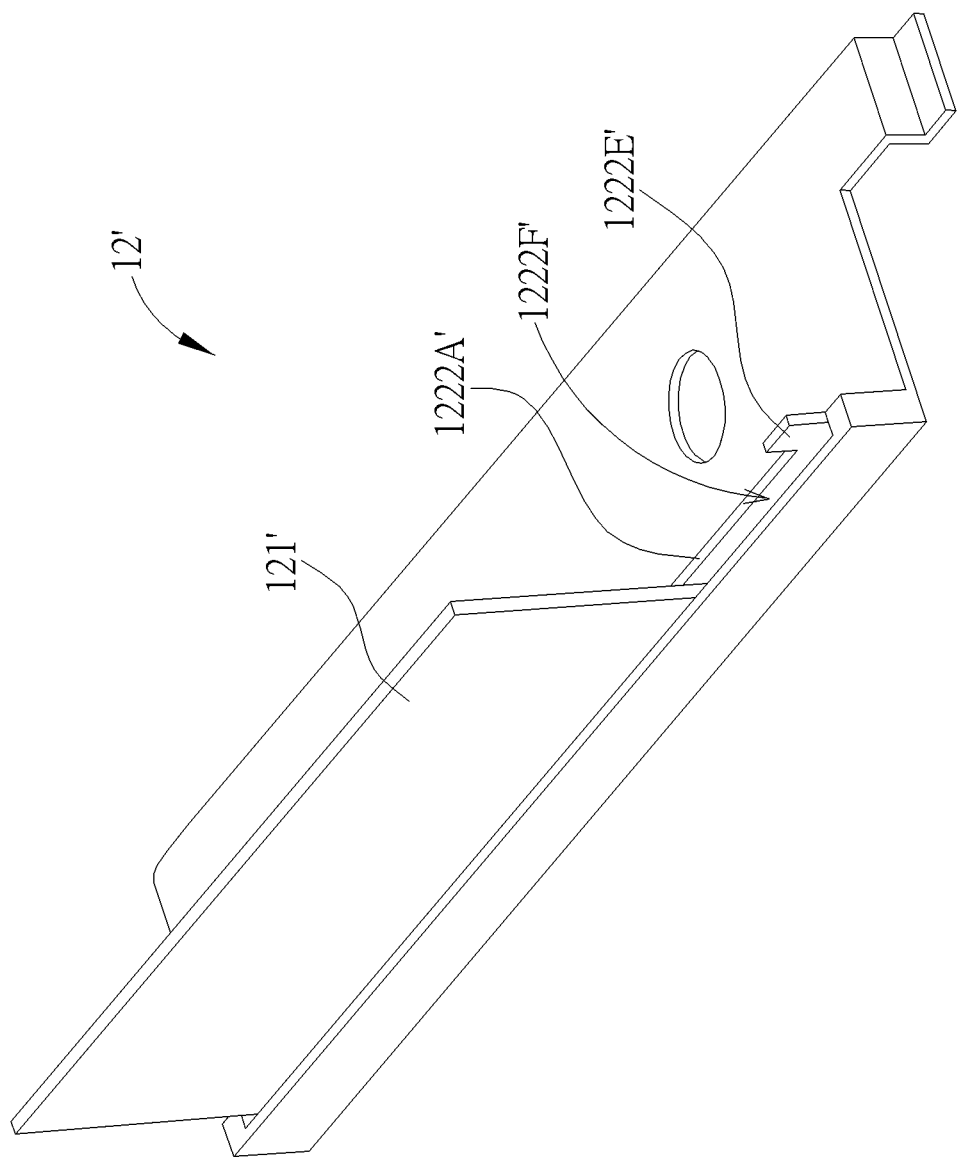

Please refer to FIG. 6 and FIG. 7. FIG. 6 and FIG. 7 are partial diagrams of an antenna structure 12' at different views according to a second embodiment of the present disclosure. As shown in FIG. 6 and FIG. 7, different from the antenna structure 12 of the first embodiment, a length L1 of an antenna body 121' of the antenna structure 12' is less than a length L2 of an accommodating slot 1222F'. A side of the antenna body 121' is welded with a corresponding welding structure 1222E. Another side of the antenna body 121' is welded with a first side wall 1222A'. However, the present disclosure is not limited thereto. In another embodiment, the antenna body 121' also can be welded with the corresponding welding structure 1222E' and not welded with the first side wall 1222A'. It depends on practical demands.

Figure 8:
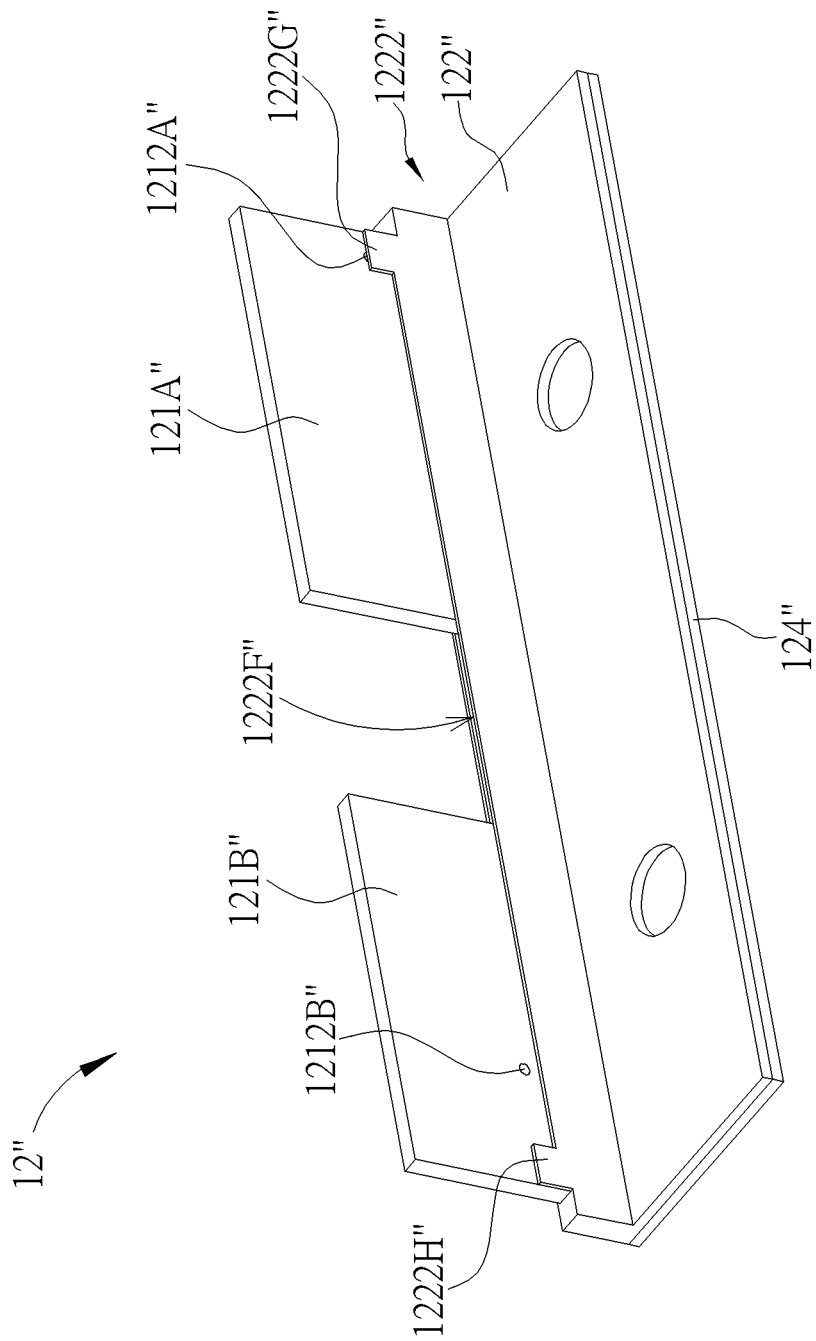
FIG. 8 is a diagram of an antenna structure according to a third embodiment of the present disclosure.

Please refer to FIG. 8. FIG. 8 is a diagram of an antenna structure 12" according to a third embodiment of the present disclosure. As shown in FIG. 8, different from the antenna structures 12, 12', the antenna structure 12" of the third embodiment can include a first antenna body 121A", a second antenna body 121B", an antenna base 122", and an adhesive layer 124". A slot structure 1222" of the antenna base 122" includes a first welding structure 1222G" and a second welding structure 1222H". The first welding structure 1222G" and the second welding structure 1222H" are welded with the first antenna body 121A" and the second antenna body 121B", respectively. The antenna base 122" can be attached on the casing 11 by the adhesive layer 124" directly. Furthermore, in this embodiment, in order to prevent signal interference between the first antenna body 121A" and the second antenna body 121B", the first antenna body 121A" and the second antenna body 121B" can be separated from each other and spaced at a distance of about 5 to 10 millimeters. When the first antenna body 121A" and the second antenna body 121B" are accommodated inside the accommodating slot 1222F", a first ground terminal 1212A" of the first antenna body 121A" is electrically connected to the first welding structure 1222G", and a second ground terminal 1212B" of the second antenna body 121B" is not electrically connected to the second welding structure 1222H", so as to isolate the first antenna body 121A" and the second antenna body 121B". However, the present disclosure is not limited thereto. In another embodiment, the first ground terminal 1212A" and the second ground terminal 1212B" also can be electrically connected to the first welding structure 1222G" and the second welding structure 1222H" respectively. Alternatively, the first antenna body 121A" and the second antenna body 121B" also can be arranged in different orientations. It depends on practical demands.

In contrast to the prior art, the present disclosure provides the two-piece antenna structure. The slot structure of the antenna base can accommodate various types of antenna bodies with various sizes according to practical demands without redesigning different molds for different antenna bases. Therefore, it effectively reduces manufacturing cost. Furthermore, the antenna base of the present disclosure is suitable for the antenna body with a specific range of size, i.e., a length of the antenna body can be designed to be less than or equal to a length of the accommodating slot. The antenna base even can accommodate multiple antenna bodies as long as the antenna bodies do not interfere with each other. Therefore, the present disclosure has a universal use.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An antenna base for fixing an antenna body on a casing, the antenna base comprising:
   a base plate fixed on the casing, a positioning hole being formed on the base plate for cooperating with a positioning component of the casing; and
   a slot structure comprising:
      a first side wall connected to the base plate;
      a second side wall connected to the base plate and opposite to the first side wall, an accommodating slot being formed between the first side wall and the second side wall for accommodating the antenna body; and
      at least one welding structure disposed on the first side wall and for welding with a portion of the antenna body exposed out of the accommodating slot and separated away from a feeding terminal of the antenna body.

2. The antenna base of claim 1, wherein the first side wall and the second side wall are substantially parallel to each other and perpendicular to the base plate.

3. The antenna base of claim 1, wherein a height of the first side wall is greater than a height of the second side wall.

4. The antenna base of claim 1, wherein the slot structure comprises two welding structures disposed on two distal ends of the first side wall respectively.

5. The antenna base of claim 1, further comprising a fixing component, a through hole being formed on the base plate, the fixing component passing through the through hole to engage with the casing, so as to fasten the base plate on the casing.

6. The antenna base of claim 1, wherein the at least one welding structure is electrically connected to a ground terminal of the antenna body when the antenna body is accommodated inside the accommodating slot.

7. The antenna base of claim 1, wherein the base plate and the slot structure are made of metal material.

8. The antenna base of claim 1, wherein the base plate comprises a main body, a first engaging component and a second engaging component, the first side wall and the second side wall are connected to the main body, and the first engaging component and the second engaging component respectively extend from two opposite sides of the main body for engaging with a first engaging slot and a second engaging slot of the casing.

9. The antenna base of claim 8, wherein the first engaging component is a hook-shaped structure, and the second engaging component is a step-shaped structure.

10. An antenna structure comprising:
    at least one antenna body for emitting or receiving wireless signals; and
    an antenna base for fixing the at least one antenna body on a casing, the antenna base comprising:
       a base plate fixed on the casing, a positioning hole being formed on the base plate for cooperating with a positioning component of the casing; and
       a slot structure comprising:
          a first side wall connected to the base plate;
          a second side wall connected to the base plate and opposite to the first side wall, an accommodating slot being formed between the first side wall and the second side wall for accommodating the at least one antenna body; and
          at least one welding structure disposed on the first side wall and for welding with a portion of the at least one antenna body exposed out of the accommodating slot and separated away from a feeding terminal of the antenna body.

11. The antenna structure of claim 10, wherein the first side wall and the second side wall are substantially parallel to each other and perpendicular to the base plate.

12. The antenna structure of claim 10, wherein a height of the first side wall is greater than a height of the second side wall.

13. The antenna structure of claim 10, wherein the at least one welding structure comprises a first welding structure and a second welding structure disposed on two distal ends of the first side wall respectively.

14. The antenna structure of claim 13, wherein the at least one antenna body comprises a first antenna body welded with the first welding structure and a second antenna body welded with the second welding structure.

15. The antenna structure of claim 14, wherein the first antenna body and the second antenna body are separated from each other and spaced at a distance of 5 to 10 millimeters.

16. The antenna structure of claim 14, wherein the first antenna body comprises a first ground terminal, the second antenna body comprises a second ground terminal, and the first ground terminal is electrically connected to the first welding structure and the second ground terminal is not electrically connected to the second welding structure when the first antenna body and the second antenna body are accommodated inside the accommodating slot.

17. The antenna structure of claim 14, wherein the first antenna body comprises a first ground terminal, the second antenna body comprises a second ground terminal, and the first ground terminal is electrically connected to the first welding structure and the second ground terminal is electrically connected to the second welding structure when the first antenna body and the second antenna body are accommodated inside the accommodating slot.

18. The antenna structure of claim 10, wherein the antenna base further comprises a fixing component, a through hole is formed on the base plate, and the fixing component passes through the through hole to engage with the casing, so as to fasten the base plate on the casing.

19. The antenna structure of claim 10, wherein the at least one antenna body comprises a ground terminal, and the at least one welding structure is electrically connected to the ground terminal when the at least one antenna body is accommodated inside the accommodating slot.

20. The antenna structure of claim 10, wherein the at least one antenna body is a printed circuit board, and the base plate and the slot structure are made of metal material.

21. The antenna structure of claim 10, wherein the base plate comprises a main body, a first engaging component and a second engaging component, the first side wall and the second side wall are connected to the main body, and the first engaging component and the second engaging component respectively extend from two opposite sides of the main body for engaging with a first engaging slot and a second engaging slot of the casing.

22. The antenna structure of claim 21, wherein the first engaging component is a hook-shaped structure, and the second engaging component is a step-shaped structure.

23. An electronic device comprising:
a casing comprising a positioning component; and
at least one antenna structure installed on the casing, the at least one antenna structure comprising:
at least one antenna body for emitting or receiving wireless signals; and
an antenna base for fixing the at least one antenna body on the casing, the antenna base comprising:
a base plate fixed on the casing, a positioning hole being formed on the base plate for cooperating with the positioning component of the casing; and
a slot structure comprising:
a first side wall connected to the base plate;
a second side wall connected to the base plate and opposite to the first side wall, an accommodating slot being formed between the first side wall and the second side wall for accommodating the at least one antenna body; and
at least one welding structure disposed on the first side wall and for welding with a portion of the at least one antenna body exposed out of the accommodating slot and separated away from a feeding terminal of the antenna body.

24. The electronic device of claim 23, wherein the first side wall and the second side wall are substantially parallel to each other and perpendicular to the base plate.

25. The electronic device of claim 23, wherein a height of the first side wall is greater than a height of the second side wall.

26. The electronic device of claim 23, wherein the at least one welding structure comprises a first welding structure and a second welding structure disposed on two distal ends of the first side wall respectively.

27. The electronic device of claim 26, wherein the at least one antenna body comprises a first antenna body welded with the first welding structure and a second antenna body welded with the second welding structure.

28. The electronic device of claim 27, wherein the first antenna body and the second antenna body are separated from each other and spaced at a distance of 5 to 10 millimeters.

29. The electronic device of claim 27, wherein the first antenna body comprises a first ground terminal, the second antenna body comprises a second ground terminal, and the first ground terminal is electrically connected to the first welding structure and the second ground terminal is not electrically connected to the second welding structure when the first antenna body and the second antenna body are accommodated inside the accommodating slot.

30. The electronic device of claim 27, wherein the first antenna body comprises a first ground terminal, the second antenna body comprises a second ground terminal, and the first ground terminal is electrically connected to the first welding structure and the second ground terminal is electrically connected to the second welding structure when the first antenna body and the second antenna body are accommodated inside the accommodating slot.

31. The electronic device of claim 23, wherein the antenna base further comprises a fixing component, a through hole is formed on the base plate, and the fixing component passes through the through hole to engage with the casing, so as to fasten the base plate on the casing.

32. The electronic device of claim 23, wherein the at least one antenna body comprises a ground terminal, and the at least one welding structure is electrically connected to the ground terminal when the at least one antenna body is accommodated inside the accommodating slot.

33. The electronic device of claim 23, wherein the at least one antenna body is a printed circuit board, and the base plate and the slot structure are made of metal material.

34. The electronic device of claim 23, wherein the base plate comprises a main body, a first engaging component and a second engaging component, the first side wall and the second side wall are connected to the main body, the first engaging component and the second engaging component respectively extend from two opposite sides of the main body, a first engaging slot and a second engaging slot are formed on the casing, and the first engaging component and the second engaging component respectively engage with the first engaging slot and the second engaging slot.

35. The electronic device of claim 34, wherein the first engaging component is a hook-shaped structure, and the second engaging component is a step-shaped structure.

36. The electronic device of claim 23, wherein the casing comprises a cover plate for covering the at least one antenna structure.

37. The electronic device of claim 23, further comprising a wireless communication unit, the at least one antenna structure further comprising a feeding cable connected to the wireless communication unit and the at least one antenna body, and the casing comprising at least one claw hook for fixing the feeding cable and at least one aperture for allowing the feeding cable to pass therethrough.

\* \* \* \* \*